(12) United States Patent
Fujiwara et al.

(10) Patent No.: US 11,527,866 B2
(45) Date of Patent: Dec. 13, 2022

(54) SEMICONDUCTOR OPTICAL DEVICE (71) Applicant: SUMITOMO ELECTRIC INDUSTRIES, LTD., Osaka (JP)

(72) Inventors: Naoki Fujiwara, Osaka (JP); Hideki Yagi, Osaka (JP); Hajime Shoji, Osaka (JP); Takuo Hiratani, Osaka (JP); Takehiko Kikuchi, Osaka (JP); Toshiyuki Nitta, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 88 days.

(21) Appl. No.: 17/078,753

(22) Filed: Oct. 23, 2020

(65) Prior Publication Data
US 2021/0126428 A1   Apr. 29, 2021

(30) Foreign Application Priority Data
Oct. 29, 2019 (JP) .............................. JP2019-195931

(51) Int. Cl.
| H01S 5/10 | (2021.01) |
| H01S 5/343 | (2006.01) |
| H01S 5/042 | (2006.01) |
| H01S 5/02 | (2006.01) |

(52) U.S. Cl.
CPC .......... *H01S 5/101* (2013.01); *H01S 5/04256* (2019.08); *H01S 5/1007* (2013.01); *H01S 5/1014* (2013.01); *H01S 5/1032* (2013.01); *H01S 5/3434* (2013.01); *H01S 5/021* (2013.01); *H01S 5/0218* (2013.01)

(58) Field of Classification Search
CPC ........ H01S 5/021; H01S 5/0218; H01S 5/101; H01S 5/1007; H01S 5/1032; H01S 3/0637; H01S 5/04257; H01S 5/0234; G02B 2006/12121; G02B 2006/12119
See application file for complete search history.

(56) References Cited

U.S. PATENT DOCUMENTS 5,396,511 A * 3/1995 Nakatsuka ............ H01S 5/4031
                                                    372/92
7,106,448 B1 * 9/2006 Vawter ............... G02B 6/12004
                                                    385/12
(Continued)

FOREIGN PATENT DOCUMENTS

CN      112134137 A  * 12/2020
FR      2933816 A1   *  1/2010   ......... G02B 6/12004
(Continued)

OTHER PUBLICATIONS

Tran et al.; "Ultra-low Noise Widely-Tunable Semiconductor Lasers Fully Integrated on Silicon"; Compound Semiconductor Week 2019; May 2019.

*Primary Examiner* — Joshua King
(74) *Attorney, Agent, or Firm* — Oliff PLC (57) ABSTRACT

A semiconductor optical device includes an SOI substrate having a waveguide of silicon, and at least one gain region of a group III-V compound semiconductor having an optical gain bonded to the SOI substrate. The waveguide has a bent portion and multiple linear portions extending linearly and connected to each other through the bent portion. The gain region is disposed on each of the multiple linear portions.

9 Claims, 4 Drawing Sheets

(56) References Cited

U.S. PATENT DOCUMENTS

| | | | | |
|---|---|---|---|---|
| 8,492,702 B2* | 7/2013 | Bahir | | H01L 31/0304 |
| | | | | 250/226 |
| 9,136,672 B2* | 9/2015 | Luo | | B82Y 20/00 |
| 9,537,289 B1* | 1/2017 | Akiyama | | H01S 5/142 |
| 10,320,151 B1* | 6/2019 | Traverso | | H01S 5/101 |
| 11,073,661 B1* | 7/2021 | Siriani | | G02B 6/29331 |
| 2005/0189591 A1* | 9/2005 | Gothoskar | | G02F 1/025 |
| | | | | 257/347 |
| 2007/0170417 A1* | 7/2007 | Bowers | | H01S 5/125 |
| | | | | 257/14 |
| 2008/0267239 A1* | 10/2008 | Hall | | H01S 5/22 |
| | | | | 438/38 |
| 2009/0016399 A1* | 1/2009 | Bowers | | B82Y 20/00 |
| | | | | 372/50.21 |
| 2009/0168821 A1* | 7/2009 | Fang | | H01S 5/02461 |
| | | | | 438/26 |
| 2010/0303469 A1* | 12/2010 | Barton | | H04B 10/6151 |
| | | | | 29/428 |
| 2011/0064106 A1* | 3/2011 | Xu | | H01S 5/1071 |
| | | | | 372/45.01 |
| 2012/0230630 A1* | 9/2012 | Dougherty | | B82Y 20/00 |
| | | | | 385/14 |
| 2012/0320939 A1* | 12/2012 | Baets | | H01S 5/1032 |
| | | | | 372/45.01 |
| 2013/0016744 A1* | 1/2013 | Li | | B82Y 20/00 |
| | | | | 372/20 |
| 2013/0259077 A1* | 10/2013 | Ben Bakir | | H01S 5/125 |
| | | | | 372/44.01 |
| 2014/0079082 A1* | 3/2014 | Feng | | H01S 5/101 |
| | | | | 372/20 |
| 2014/0153600 A1* | 6/2014 | Luo | | B82Y 20/00 |
| | | | | 372/40 |
| 2014/0161146 A1* | 6/2014 | Ben Bakir | | H01S 5/323 |
| | | | | 372/45.012 |
| 2014/0269800 A1* | 9/2014 | Purnawirman | | H01S 3/17 |
| | | | | 359/344 |
| 2014/0376857 A1* | 12/2014 | Chantre | | H01S 5/1032 |
| | | | | 438/31 |
| 2015/0132002 A1* | 5/2015 | Krishnamurthy | | H01S 5/142 |
| | | | | 398/79 |
| 2015/0236472 A1* | 8/2015 | Ide | | H05K 1/0268 |
| | | | | 438/15 |
| 2015/0288148 A1* | 10/2015 | Takabayashi | | H01S 3/06716 |
| | | | | 372/6 |
| 2015/0333475 A1* | 11/2015 | Blumenthal | | H01S 5/0206 |
| | | | | 372/27 |
| 2015/0378100 A1* | 12/2015 | Dong | | H01S 5/021 |
| | | | | 438/31 |
| 2017/0170630 A1* | 6/2017 | Uemura | | H01S 5/323 |
| 2017/0201070 A1* | 7/2017 | Evans | | H01S 5/4025 |
| 2017/0353001 A1* | 12/2017 | Takabayashi | | H01S 5/1007 |
| 2018/0331500 A1* | 11/2018 | Cheung | | H01S 5/4068 |
| 2018/0366901 A1* | 12/2018 | Shim | | H01S 5/142 |
| 2019/0072717 A1* | 3/2019 | Iida | | G02B 6/125 |
| 2019/0089132 A1* | 3/2019 | Soda | | H01S 5/141 |
| 2019/0267779 A1* | 8/2019 | Baehr-Jones | | H01S 5/1028 |
| 2020/0059068 A1* | 2/2020 | Cohen | | G02F 1/313 |
| 2020/0161832 A1* | 5/2020 | Wilmart | | H01S 5/3013 |
| 2020/0280171 A1* | 9/2020 | Siriani | | G02B 6/1228 |
| 2020/0358248 A1* | 11/2020 | Kurczveil | | H01S 5/3412 |
| 2021/0091529 A1* | 3/2021 | Siriani | | H01S 3/2308 |
| 2021/0384709 A1* | 12/2021 | Takabayashi | | H01S 5/50 |

FOREIGN PATENT DOCUMENTS

| | | | | |
|---|---|---|---|---|
| JP | H05129720 A | * | 5/1993 | |
| WO | WO-2014107537 A1 | * | 7/2014 | H01S 3/10061 |
| WO | WO-2017200620 A2 | * | 11/2017 | H01S 5/021 |
| WO | WO2018235317 A1 | * | 12/2018 | |
| WO | WO-2019048740 A1 | * | 3/2019 | G02B 6/13 |

* cited by examiner

SEMICONDUCTOR OPTICAL DEVICE

CROSS-REFERENCE TO RELATED APPLICATION

This application is based upon and claims the benefit of priority of the prior Japanese Patent Application No. 2019-195931, filed on Oct. 29, 2019, the entire contents of which are incorporated herein by reference.

FIELD

The present disclosure relates to a semiconductor optical device.

BACKGROUND

A technique for bonding gain regions formed of a group III-V compound semiconductor to a SOI (Silicon On Insulator) substrate (so-called silicon photonics) on which a waveguide is formed is known (for example, see "Ultra-low Noise Widely-Tunable Semiconductor Lasers Fully Integrated on Silicon", M. A. Tran et al., Compound Semiconductor Week 2019, TuA3-1).

SUMMARY

A semiconductor optical device according to the present disclosure includes an SOI substrate having a waveguide of silicon and at least one gain region of a group III-V compound semiconductor having an optical gain bonded to the SOI substrate, wherein the waveguide has a bent portion and multiple linear portions extending linearly and connected to each other through the bent portion, wherein the gain region is disposed on each of the multiple linear portions.

DESCRIPTION OF EMBODIMENTS

To increase a monochromaticity of a laser beam by narrowing a spectral linewidth, and to increase the output of the laser beam, a long gain region is effective. The longer the gain region becomes, the larger a semiconductor optical device becomes.

Description of Embodiments of the Disclosure

Contents of embodiments of the present disclosure will be described below.

One form of the present disclosure is a semiconductor optical device. (1) The semiconductor optical device comprises an SOI substrate having a waveguide of silicon and at least one gain region of a group III-V compound semiconductor having an optical gain bonded to the SOI substrate, wherein the waveguide has a bent portion and multiple linear portions extending linearly and connected to each other through the bent portion, wherein the gain region is disposed on each of the multiple linear portions. It is possible to miniaturize the semiconductor optical device by bending the waveguide. It is also possible to obtain good characteristics such as narrow spectral line width and high output by a plurality of gain regions.

(2) The bending angle of the waveguide may be 90° or more. It is possible to miniaturize the semiconductor optical device.

(3) The semiconductor optical device may comprise a first insulating film provided on both sides of the bent portion. The refractive index difference between the bent portion and the first insulating film is large. And good effect of confinement light is achieved. Therefore, the loss of light in the bent portion is suppressed.

(4) The semiconductor optical device may comprise a second insulating film covering a side surface of the gain region, wherein a width of the gain region is larger than a width of the waveguide. Compared with the waveguide, the light confinement of the gain region in the transverse direction is weak. Since the gain region is provided in the linear portion and does not bend, the loss of light is suppressed.

(5) The radius of curvature of the bent portion may be 10 μm or more. Thus it is possible to miniaturize the semiconductor optical device.

(6) The waveguide may include three or more of the linear portions, and the gain region may be disposed on each of the three or more linear portions. Thus it is possible to obtain good characteristics, and miniaturize the semiconductor optical device.

(7) The semiconductor optical device may comprise a first electrode and a second electrode provided on the SOI substrate, wherein the gain region includes an n-type semiconductor layer, a core layer and a p-type semiconductor layer that are stacked in this order from the SOI substrate, wherein the n-type semiconductor layer, the core layer, and the p-type semiconductor layer are each formed of a group III-V compound semiconductor, wherein the first electrode is connected to the n-type semiconductor layer, and the second electrode is connected to the p-type semiconductor layer. It is possible to inject carriers into the core layer by using the first electrode and the second electrode.

(8) The at least one gain region comprises a plurality of gain regions, each of the gain regions having the core layer and the p-type semiconductor layer, wherein the n-type semiconductor layer is shared by the gain regions and electrically connects the gain regions, wherein the first electrode is provided on the n-type semiconductor layer, and has a first connection portion and a first pad portion connected to the n-type semiconductor layer, wherein the first connection portion is located between the gain regions, wherein the first pad portion is connected to the first connection portion, wherein the first pad portion has a width larger than the first connection portion, wherein the second electrode has a second connection portion and a second pad portion connected to the p-type semiconductor layer, wherein the second connection portion is provided on the p-type semiconductor layer of each of the plurality of gain regions, wherein the second pad portion is connected to the second connection portion, and has a width larger than the second connection portion. It is possible to inject carriers into the core layer by using the first electrode and the second electrode.

Further, it is possible to reduce the electrical resistance by the first connecting portion and the second connecting portion.

(9) The gain region may have a tapered portion located above the waveguide. The efficiency of the optical coupling can be enhanced between the gain region and the waveguide.

(10) The SOI substrate may be optically coupled to the waveguide and have a resonator formed of silicon. It is possible to select a wavelength of light by using the resonator.

Details of Embodiments of the Present Disclosure

A specific example of the semiconductor optical device according to the embodiment will be described below with reference to the drawings. It should be noted that the present invention is not limited to these examples, but is indicated by the claims, and it is intended to include all modifications within the meaning and range equivalent to the claims.

First Embodiment

Figure 1A:
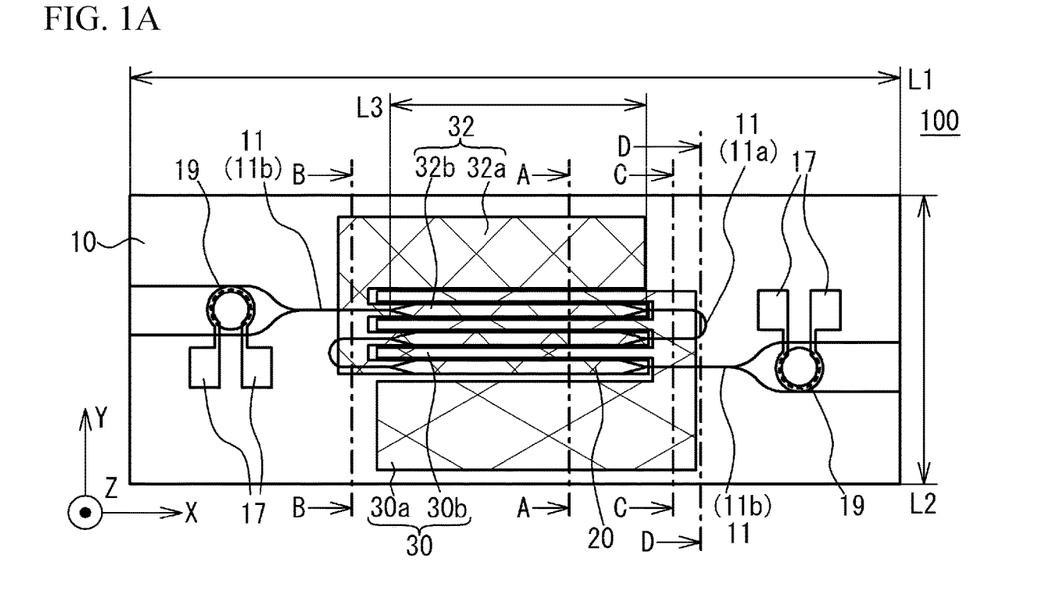
FIG. 1A is a plan view illustrating a semiconductor optical device according to a first embodiment.
Figure 1B:
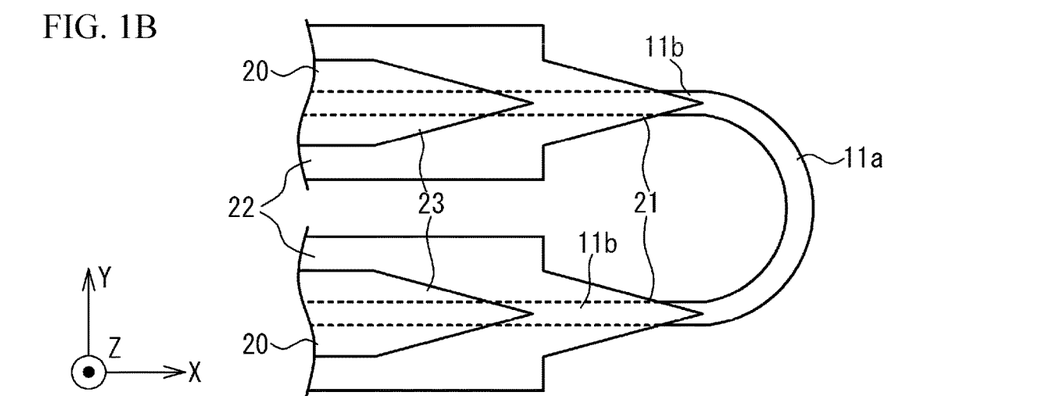
FIG. 1B is a plan view of enlarging a vicinity of a gain region.

FIG. 1A is a plan view illustrating a semiconductor optical device 100 according to the first embodiment. FIG. 1B is a plan view of enlarging the vicinity of a gain region. FIG. 2A to FIG. 2D are cross-sectional views illustrating the semiconductor optical device 100.

As illustrated in FIG. 1A and FIG. 1B, the semiconductor optical device 100 has a substrate 10 and a gain region 20. Semiconductor optical device 100 is a tunable laser device of the hybrid type using a silicon photonics. Three gain regions 20, two ring resonators 19, an electrode 17, an electrode 30 and an electrode 32 are provided on the surface of the substrate 10. Surface of the semiconductor optical device 100 is covered with an insulating film (not illustrated).

Figure 2A:
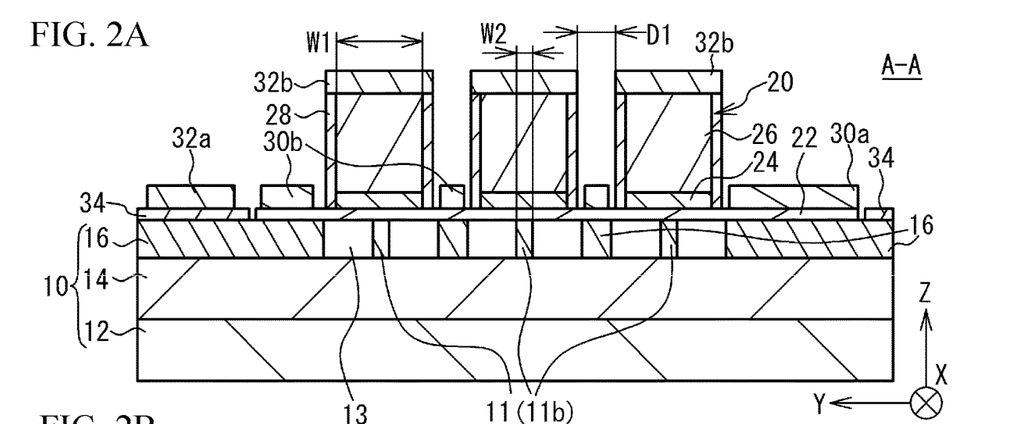
FIG. 2A to FIG. 2D are sectional views illustrating the semiconductor optical device.

As illustrated in FIG. 2A, the gain region 20 is located above a waveguide 11. The gain region 20 comprises an n-type semiconductor layer 22, a core layer 24 and a p-type semiconductor layer 26 which are stacked in this order. As illustrated in FIG. 2A to FIG. 2D, the substrate 10 is an SOI substrate comprising a substrate 12, a silicon dioxide ($SiO_2$) layer 14, and a silicon (Si) layer 16 stacked in this order. The thickness of the $SiO_2$ layer 14 is, for example, 2 µm. The thickness of the Si layer 16 is, for example, 220 nm. The waveguide 11 and the ring resonator 19 illustrated in FIG. 1A are arranged in the Si layer 16 of the substrate 10. The end face of the substrate 10 is coated with an anti-reflection film to prevent reflection of light. Length L1 in the X-axis direction of the semiconductor optical device 100 is, for example, 1700 µm. Length L2 of the Y-axis direction of the semiconductor optical device 100 is, for example, 600 µm.

As illustrated in FIG. 1A and FIG. 1B, the waveguide 11 has two bent portions 11a and three linear portions 11b. The bent portion 11a has, for example, a semicircular arc shape. The bent portion 11a may have a shape in which a clothoid curve or a raised cosine curve is combined. The linear portions 11b are arranged one by one at both ends of the bent portion 11a. Each linear portion 11b extends in the X-axis direction. The three linear portions 11b are arranged in the Y-axis direction, are separated from each other, and are connected to each other via two bent portions 11a. That is, in the region sandwiched between the two ring resonators 19 of the substrate 10, the waveguide 11 bent 180° in the bent portion 11a is disposed.

As illustrated in FIG. 1A, the linear portion 11b located the most Y-axis positive side of the three linear portions 11b branches into two in the vicinity of the end portion of the X-axis negative side of the substrate 10. In other words, two waveguides 11 are arranged. These two waveguides 11 are optically coupled to the ring resonator 19 and reach the end of the X-axis negative side of the substrate 10. The linear portion 11b located on the Y-axis negative side of the three linear portions 11b is branched into two near the end of the X-axis positive side of the substrate 10. In other words, two waveguides 11 are arranged. These two waveguides 11 are optically coupled to the ring resonator 19 and reach the end of the X-axis positive side of the substrate 10. Both ends of the linear portion 11b of the center of the three linear portions 11b are connected to the bent portion 11a.

The gain region 20 is bonded on each of the three linear portions 11b. The gain region 20 is not joined to the bent portion 11a. One gain region 20 overlaps one linear portion 11b, and optically coupled with each other. The gain region 20 has a linear shape extending in the X-axis direction, similarly to the linear portion 11b. Length L3 in the X-axis direction of the gain region 20 is, for example, 800 µm.

The electrode 30 is an n-type ohmic electrode and has a pad 30a and three connection portions 30b. The electrode 32 is a p-type ohmic electrode and has a pad 32a and three connection portions 32b. The pad 30a is located on the Y-axis negative side of the three gain regions 20. A connecting portion 30b is electrically connected to the pad 30a. The connecting portion 30b is adjacent to the gain region 20, and spaced from the gain region 20. The connecting portion 30b extends in the X-axis direction. The pad 32a is located on the Y-axis positive side of the three gain regions 20. A connecting portion 32b is electrically connected to the pad 32a. The connecting portion 32b is arranged above the gain region 20. The connecting portion 32b extends in the X-axis direction.

The electrodes 30 are formed of metals such as gold, germanium or a Ni alloy (AuGeNi). The electrodes 32 are, for example, laminates of titanium, platinum and gold (Ti/Pt/Au). The thickness of the electrodes 30 and 32 is, for example, 1 The width of each of the pad 30a and the pad 32a in the Y-axis direction is, for example, 100 µm or more. The width of the connecting portion 30b is, for example, 15 µm. An Au plating layer or the like may be provided on the electrodes 30 and 32. The electrode 17 is provided on top of the ring resonator 19 and is formed of a metal such as Ti, for example.

The gain region 20 and the n-type semiconductor layer 22 as illustrates in FIG. 1B has a tapered portion 21 and a tapered portion 23, respectively. The tapered portion 21 and the tapered portion 23 are tapered along the X-axis direction. The tapered portion 21 and the tapered portion 23 are located above the waveguide 11. The tapered portion 21 is provided at the end of the n-type semiconductor layer 22 in the X-axis direction. The tapered portion 23 is above the tapered portion 21, and is provided at the end in the X-axis direction of the core layer 24 and the p-type semiconductor layer 26 of the gain region 20. The length of each of the tapered portion 21 and the tapered portion 23 is, for example, 150 The width of each tip of the tapered portion 21 and the tapered portion 23 is, for example, 0.4 The tapered portion 21 and the tapered portion 23 are also provided on the end side of the X-axis negative side of the gain region 20.

Figure 2B:
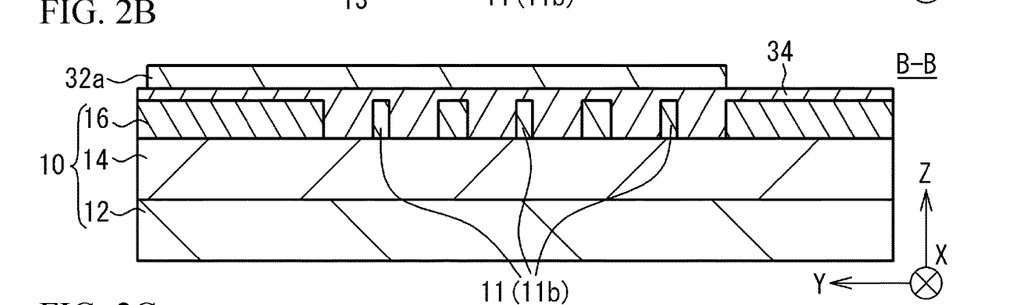
Figure 2C:
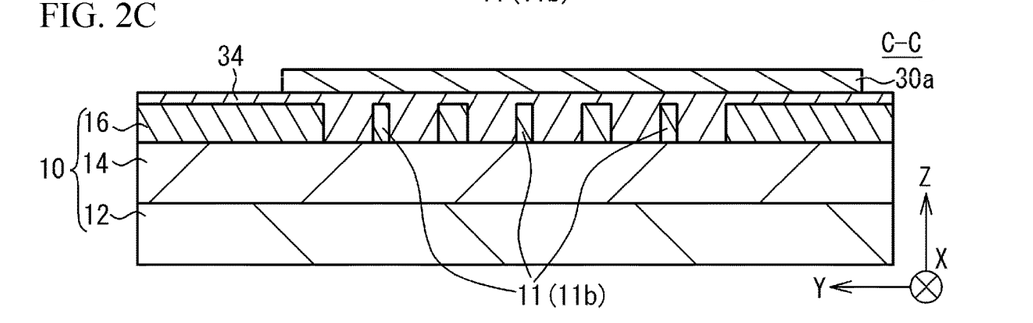
Figure 2D:
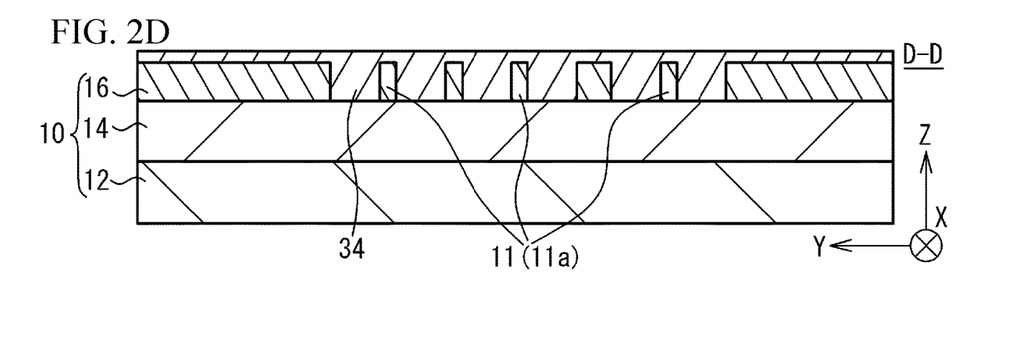

FIG. 2A is a sectional view taken along a line A-A of FIG. 1A. FIG. 2B is a cross-sectional view taken along a line B-B of FIG. 1A. FIG. 2C is a sectional view taken along a line C-C of FIG. 1A. FIG. 2D is a cross-sectional view taken along a line D-D of FIG. 1A.

As illustrated in FIG. 2A, the waveguide 11 and the groove 13 are provided in the Si layer 16 of the substrate 10. The grooves 13 are located on both sides in the Y-axis direction of one waveguide 11. The width W2 of the waveguide 11 and the width of the groove 13 is, for example, 1 respectively. The $SiO_2$ layer 14 may be exposed in the groove 13. The Si layer 16 may be a bottom surface of the groove 13. In the portion of the waveguide 11 overlapping the gain region 20, the side surface of the waveguide 11 is exposed to air.

An insulating film 34 is provided on the surface of the substrate 10. As illustrated in FIG. 2B to FIG. 2D, the portion of the waveguide 11 that does not overlap the gain region 20 is covered with the insulating film 34. Between each of the waveguides 11 and between the waveguide 11 and the Si layer 16 are embedded with The insulating film 34. As illustrated in FIG. 2B and FIG. 2C, the insulating film 34 is interposed between the waveguide 11 and the pad 30a. And the insulating film 34 is interposed between the waveguide 11 and the pad 32a. The pad 30a and the pad 32a are not in contact with the waveguide 11. As illustrated in FIG. 2D, the side surface and the upper surface of the bent portion 11a of the waveguide 11 are covered with the insulating film 34. The bent portion 11a may not necessarily overlap with the pad, or may overlap with the pad.

As illustrated in FIG. 2A, the gain region 20 is located above the waveguide 11. The gain region 20 has a structure in which the n-type semiconductor layer 22, the core layer 24 and the p-type semiconductor layer 26 stacked in this order. The width W1 in the Y-axis direction of the core layer 24 and the p-type semiconductor layer 26 in one gain region 20 is, for example, 2 μm. The n-type semiconductor layer 22 is provided over the three waveguides 11. The n-type semiconductor layer 22 is shared by the three gain regions 20. The three gain regions 20 are electrically connected by the n-type semiconductor layer 22. The side surfaces of the core layer 24 and the p-type semiconductor layer 26 are covered with an insulating film 28. The distance D1 between the insulating films 28 is, for example, 20 μm.

The n-type semiconductor layer 22 is formed of an n-type indium phosphorus (n-InP) layer having a thickness of, for example, 0.3 μm. The core layer 24 includes a plurality of well layers and barrier layers formed of, for example, non-doped gallium indium arsenide phosphorus (i-GaInAsP). The core layer 24 has a multiple quantum-well (MQW: Multi Quantum Well) structure. The thickness of the core layer 24 is, for example, 0.3 μm. The p-type semiconductor layer 26 is formed of, for example, a p-InP layer having a thickness of 2 μm. The p-type semiconducting layer 26 may further comprise a layer of p-type gallium indium arsenide (p-GaInAs) on top of p-InP. The insulating films 28 and 34 are formed of an insulator such as $SiO_2$. The thickness of the insulating film 28 is, for example, 0.5 μm. The thickness of the insulating film 34 is, for example, 1.5 μm.

As illustrated in FIG. 2A, the pad 30a and the connecting portion 30b are provided on the surface of the n-type semiconductor layer 22. The pad 30a and the connecting portion 30b are electrically connected to the n-type semiconductor layer 22. As illustrated in FIG. 2B and FIG. 2C, the pad 30a and the pad 32a are located on the surface of the insulating film 34. The pads 30a and the pad 32a are spaced from the waveguide 11. As illustrated in FIG. 2A, the connecting portion 32b is provided on the surface of the p-type semiconductor layer 26. The connecting portion 32b is electrically connected to the p-type semiconductor layer 26.

Each gain region 20 has a pin structure along the Z-axis direction. By applying a voltage to the electrode 30 and the electrode 32, carriers are injected into the core layers 24 of the three gain regions 20. The core layer 24 into which carriers are injected emits light. Light propagates through the waveguide 11 and enters the ring resonator 19. The ring resonator 19 reflects a portion of the light to the gain region 20 side. The ring resonator 19 transmits a portion of the light. Light can be emitted from any one of the four waveguides 11 reaching the end of the substrate 10. Since the two ring resonators 19 have different radii from each other. And the ring resonators 19 also have different reflection spectrum. The wavelength at which the reflection peaks of the two ring resonators 19 coincide becomes the oscillation wavelength. The electrode 17 functions as a heater that generates heat upon input of power. By changing the temperature of the ring resonator 19 by the electrode 17, the refractive index of the ring resonator 19 changes. By the change in the refractive index, the oscillation wavelength is made variable within a range of, for example, 40 nm. The oscillation wavelength is, for example, 1550 nm±20 nm.

A method of manufacturing the semiconductor optical device 100 will be described. The waveguide 11 and the ring resonator 19 are formed on the surface of the wafer-like substrate 10. The substrate 10 may be provided with an optical circuit such as a modulator. The p-type semiconductor layer 26, the core layer 24, and the n-type semiconductor layer 22 are epitaxially grown in this order on a compound semiconductor wafer by using a metalorganic vapor phase epitaxy (OMVPE: Organometallic Vapor Phase Epitaxy) method or the like. The wafer is cut to form a plurality of small pieces. Next, the small pieces are bonded to the substrate 10. As an example, the small pieces and the substrate 10 may be activated by irradiating the surface of the small pieces and the substrate 10 with plasma. By performing etching the small pieces, the gain region 20 illustrated in FIG. 1A and FIG. 2A is formed. The substrate 10 is diced to obtain a plurality of the semiconductor optical devices 100.

Figure 3:
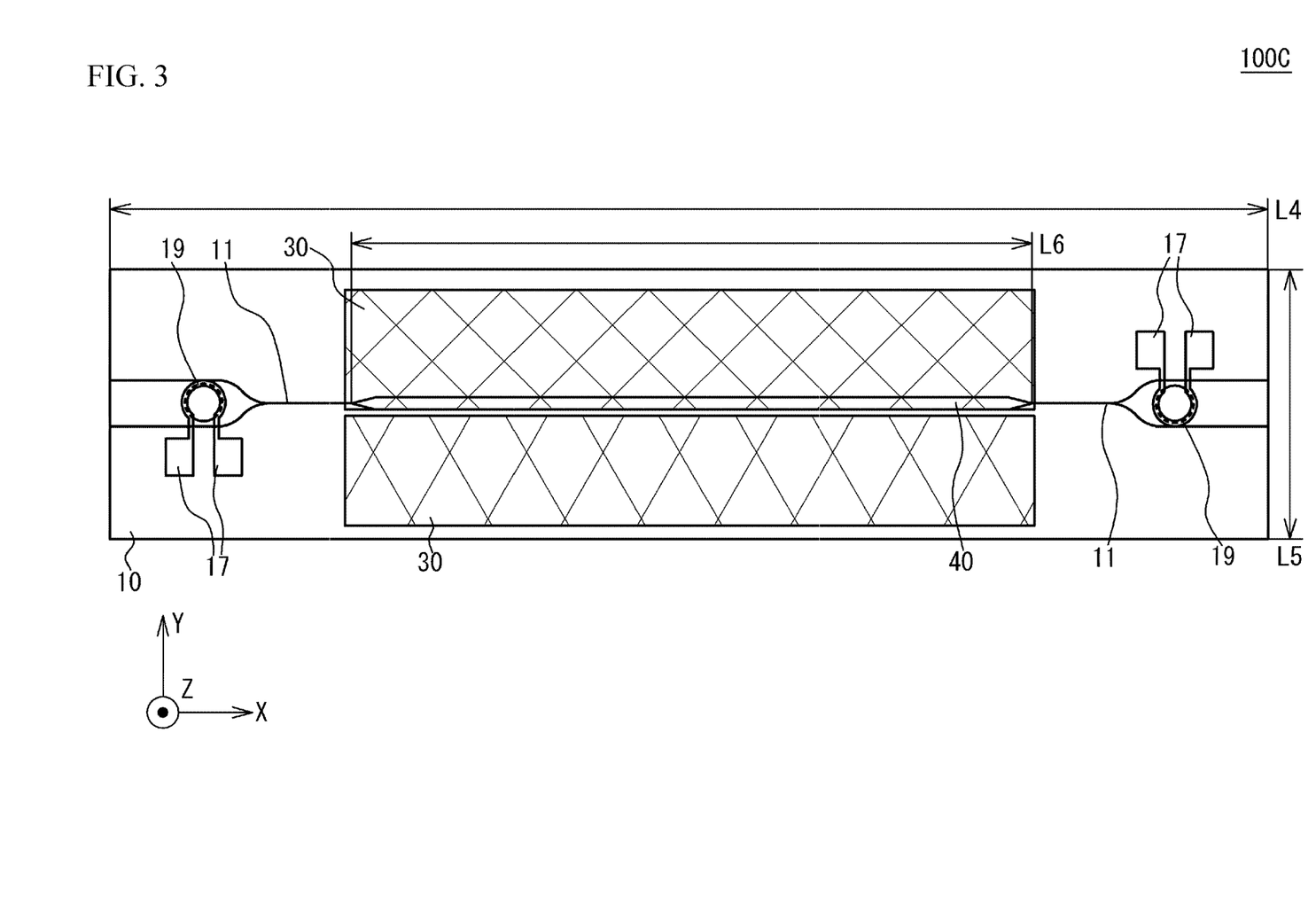
FIG. 3 is a plan view illustrating a semiconductor optical device according to a comparative example.

FIG. 3 is a plan view illustrating a semiconductor optical device 100C according to a comparative example. The waveguide 11 of the semiconductor optical device 100C does not have a bent portion, extends in the X-axis direction, and is optically coupled to the ring resonator 19. The semiconductor optical device 100C has one gain region 40.

To narrow the spectral line width, and to obtain a high light output is required to increase the length of the gain region 40. For example, the length L6 of the gain region 40 is made longer than the length L3 in the first embodiment in order to obtain a spectral line width and an optical output equivalent to those of the three gain regions 20 in the first embodiment in one gain region 40. The length L6 of the gain region 40 is, for example, 2400 μm. For mounting a long gain region 40, the length L4 in the X-axis direction of the substrate 10 is larger than the length L1 of the first embodiment. The length L4 of the substrate 10 in the X-axis direction is, for example, 3300 μm. The length L5 of the substrate 10 in the Y-axis direction is, for example, 600 μm, which is the same as L2. As described above, in the comparative example, the semiconductor optical device 100C is increased in size. As a result, the cost is increased because the number of semiconductor optical elements obtained from one wafer is reduced.

On the other hand, according to the first embodiment, the waveguide 11 includes a bent portion 11a and a linear portion 11b. The gain region 20 is joined to each of the three linear portions 11b. Three gain regions 20 provide spectral line widths as narrow as one long gain region 40 and high optical output. Since the waveguide 11 is bent, it is possible to miniaturize the semiconductor optical device 100.

As illustrated in FIG. 1A and FIG. 1B, the waveguide 11 is folded by 180° in the bent portion 11a, and has a zigzag shape. Thus it is possible to parallel the three linear portions 11b on the substrate 10. Like the linear portion 11b, three gain regions 20 are in parallel. As a result, it is possible to effectively miniaturize the semiconductor optical device 100. Specifically, the length L3 of one gain region 20 is about ⅓ of the length L6 of the gain region 40. The length L1 in the X-axis direction of the semiconductor optical device 100 can be about half of the length L4 of the comparative example. Therefore it is possible to reduce the size of the semiconductor optical device 100 to about 50% of the comparative example. Since it is possible to increase the number of semiconductor optical elements 100 obtained from one wafer to about 1.4 times, it is possible to reduce the cost.

The waveguide 11 is formed of Si. Grooves 13 are provided on both sides of the portion of the waveguide 11 overlapping the gain region 20 illustrated in FIG. 2A. Therefore both sides of the portion of the waveguide 11 overlapping the gain region 20 are exposed to the air. The portion of the waveguide 11 that does not overlap the gain region 20 illustrated in FIG. 2B to FIG. 2D is covered with the insulating film 34. The refractive index of Si is approximately 3.5. The refractive index of air is 1. The refractive index of the insulation film 34 composed of $SiO_2$ is approximately 1.5. The refractive index difference between the waveguide 11 and the outside is large, and a light confinement of the waveguide 11 is enhanced. Therefore the loss of light in the waveguide 11 including the bent portion 11a is small.

The insulating film 34 provided on both sides of the bent portion 11a may be formed of an insulator such as a $SiN_x$ (x represents composition) or a polymer in addition to $SiO_2$. To enhance the light confinement, the insulating film having a large difference of the refractive index with Si is preferable. Both sides of the bent portion 11a may be exposed to air. The groove 13 may be embedded in the insulating film 34.

The radius of curvature of the bent portion 11a is, for example, 50 μm. Therefore, it is possible to reduce the distance between the linear portions 11b. Therefore it is possible to effectively miniaturize the semiconductor optical device 100. The radius of curvature may be 50 μm or less, 30 μm or less, or 20 μm or less. The radius of curvature is 10 μm or more. Miniaturization is possible by reducing the radius of curvature. Further, since the optical confinement of the waveguide 11 is enhanced, the loss of light, even if the radius of curvature is small, is suppressed.

On the other hand, the gain region 20 is formed of a group III-V compound semiconductor. The refractive index of the group III-V compound semiconductors is lower than that of Si. Thus the refractive index difference between the insulating film 28 on the side surface of the gain region 20 and the gain region 20 is smaller than the refractive index difference between the Si and the insulating film. Since the lateral light confinement is small, the loss of light is increased by bending the gain region 20 with a small radius of curvature. In the first embodiment, the gain region 20 is linear, and the waveguide 11 is bent. Thus, the loss of light is suppressed.

The core layer 24 and the p-type semiconductor layer 26 of the gain region 20 have a high mesa structure with a narrow width. And, the side surface of the gain region 20 is exposed to air having a small refractive index. Thus, it is possible to suppress an increase in loss due to bending at a small radius of curvature. However, the core layer 24 of the high mesa structure processed to be as thin as the waveguide 11 is apt to deteriorate with time when carrier injection is continued for a long period of time. The gain region 20 exposed to air is also susceptible to degradation over time from the sides of the MQW. The width of the gain region 20 of the first embodiment is larger than the waveguide 11. And, loss with time hardly occurs, because the side surface is covered with the insulating film 28. On the other hand, the transverse light confinement is small and the loss due to bending becomes large. In order to suppress an increase in light loss, the radius of curvature becomes 200 μm or more, and miniaturization is difficult. In the first embodiment, the strong waveguide 11 of the light confinement is bent, and a plurality of gain regions 20 have a linear shape. It is possible to achieve both suppression and miniaturization of the loss of light.

The gain region 20 has a pin structure having the n-type semiconductor layer 22, the core layer 24 and the p-type semiconductor layer 26. Carriers are injected into the core layer 24 by applying voltages to the electrode 30 and the electrode 32. The gain region 20 emits light by injecting carriers.

The n-type semiconductor layer 22 is shared by the three gain regions 20. The pad 30a and the connecting portion 30b of the electrode 30 are connected to the n-type semiconductor layer 22. The electrode 32 has the pad 32a and the connection portion 32b. The connection portion 32b is located above each gain region 20. The connecting portion 32b is connected to the p-type semiconductor layer 26. By applying a voltage between the pad 30a and the pad 32a, carriers can be injected into the plurality of gain regions 20. As a result, the plurality of gain regions 20 can emit light. In this example, it is possible to miniaturize the semiconductor optical device 100, compared to the case of providing a pair of pad 30a and pad 32a in each of the plurality of gain regions 20.

The connection portion 30b made of metal is provided between the gain regions 20, and the wide pad 30a and the pad 32a are provided on the substrate 10. Thus, the heat dissipation property is improved. Furthermore, the electrical resistance is also reduced. Incidentally, the pad 30a of the electrode 30 illustrated in FIG. 2A is connected to the n-type semiconductor layer 22. Therefore, even if the connection portion 30b extending adjacent to the gain region 20 is not provided, light emission of the gain region 20 is possible.

Light propagates in the X direction while spreading in a certain range in the YZ plane and being distributed. Locating the metal electrodes 30 and/or 32 inside the distribution of light increases the loss of light. Preferably, the electrode 30 and the electrode 32 are not in contact with the waveguide 11. As illustrated in FIG. 2B and FIG. 2C, by covering the waveguide 11 with the insulating film 34, contact between the electrode 30 and the electrode 32 is prevented.

The gain region 20 has the tapered portion 21. The n-type semiconductor layer 22 has the tapered portion 23. The width of the tip of the tapered portion 21 and the tapered portion 23 is 0.4 μm and narrow. Therefore, the efficiency of the optical coupling between the gain region 20 and the waveguide 11 is improved to 90% or more. The gain region 20 may not necessarily have the tapered portion 21. The n-type semiconductor layer 22 may not necessarily have the tapered portion 23. Either one of the gain region 20 or the n-type semiconductor layer 22 may have the tapered portion. If the tapered portion is omitted, the efficiency of optical coupling is lowered. However, since the processing of the thin tip can be omitted, the manufacturing becomes easy.

The number of the linear portions 11b may be three, two, or four or more. The number of gain regions 20 may be three, two, or four or more. It is possible to further miniaturize the semiconductor optical device 100 by increasing the number of linear portions 11b and/or the gain region 20. However, even when the coupling efficiency is 90%, light loss may occur in the coupling portion between the gain region 20 and the waveguide 11. Therefore, as the number of the linear portions 11b and the gain regions 20 increases, the coupling portion increases and the loss of light also increases. To achieve both miniaturization and suppression of loss of light, the number of the linear portion 11b and the gain region 20 is determined. The waveguide 11 is optically coupled with the ring resonator 19. Therefore it is possible to select the wavelength in the miniaturized semiconductor optical device 100. Instead of the ring resonator 19, a grating-type distributed reflector formed of the waveguide 11 made of Si may be provided for wavelength selection. Further, the two waveguides 11, instead of reaching the end of the X-axis positive side of the substrate 10, may be connected to a bent waveguide for returning light such as a loop mirror waveguide.

Second Embodiment

Figure 4A:
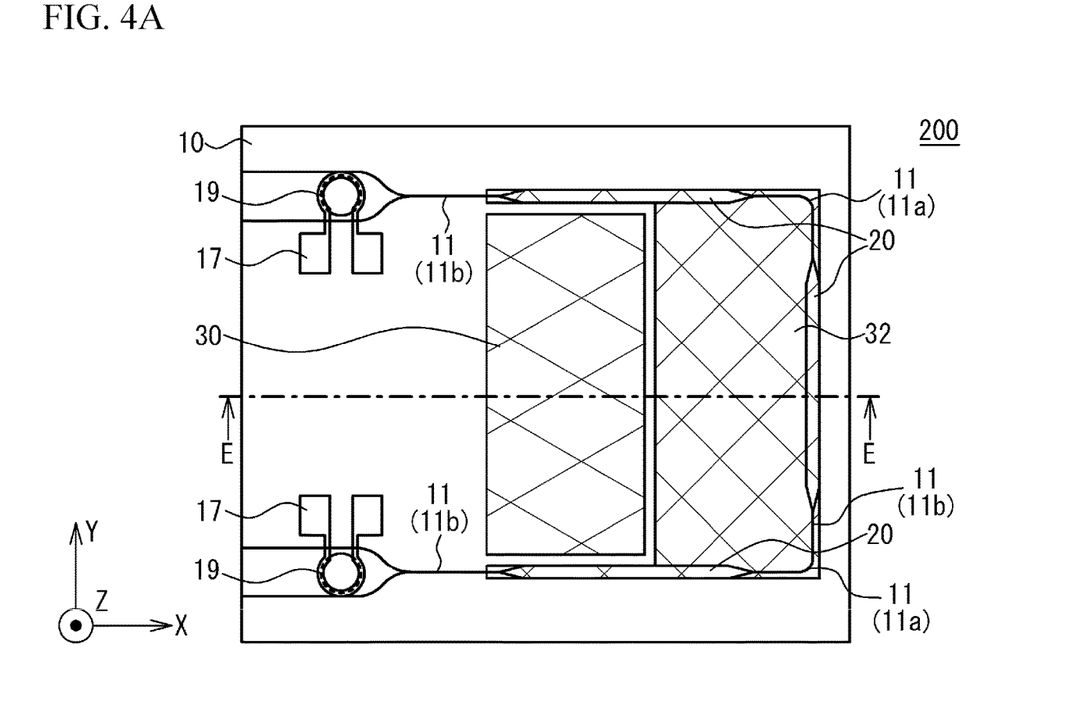
FIG. 4A is a plan view illustrating a semiconductor optical device according to a second embodiment.
Figure 4B:
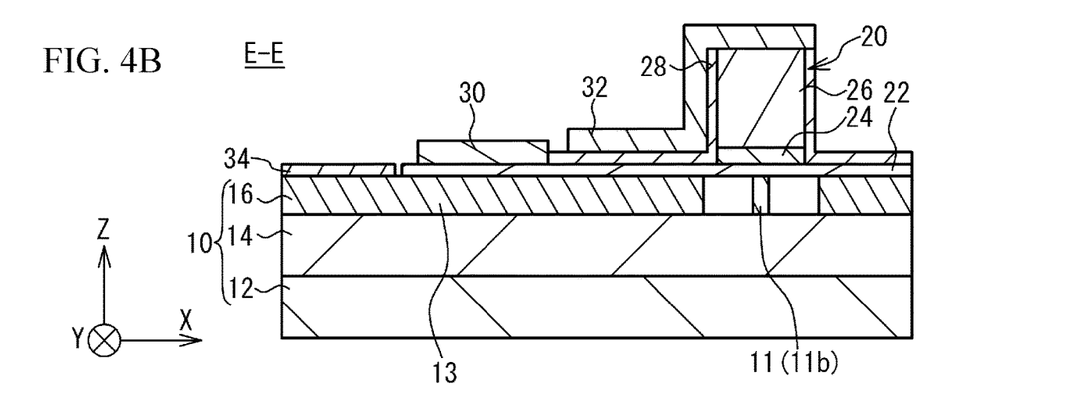
FIG. 4B is a cross-sectional view illustrating the semiconductor optical device.

FIG. 4A is a plan view illustrating a semiconductor optical device 200 according to the second embodiment. FIG. 4B is a sectional view illustrating the semiconductor optical device 200 and illustrating a cross section along the line E-E in FIG. 4A. Description of the same configuration as that of the first embodiment is omitted.

As illustrated in FIG. 4A, the waveguide 11 has two bent portions 11a and three linear portions 11b. The bent portion 11a corresponds to ¼ of the arc. The linear portions 11b are connected to both ends of the bent portion 11a. The bending angle of the waveguide 11 is 90°. Two of the three linear portions 11b extend in the X-axis direction. One end of the two linear portions 11b is optically coupled with the ring resonator 19 in the vicinity of the X-axis negative end portion of the substrate 10, and the other end is connected to the bent portion 11a. One of the three linear portions 11b extends in the Y-axis direction. Both ends of the linear portion 11b extending in the Y-axis direction is connected to the bent portion 11a. The gain region 20 of the linear shape is joined to each of the three linear portions 11b. The gain region 20 is not bonded to the bent portion 11a.

The electrode 30 and the electrode 32 are provided at a position surrounded by the three linear portions 11b on the substrate 10 illustrated in FIG. 4A. The electrode 32 illustrated in FIG. 4B is located on the X-axis positive side than the electrode 30. The electrode 32 is provided over the gain region 20 from above the insulating film 34. According to the second embodiment, by bending the waveguide 11 by 90°, the size of the semiconductor optical device 200 can be reduced to about 50% of that of the comparative example, similarly to the first embodiment.

The waveguide 11 of the first embodiment is bent by 180° and has a shape that reciprocates in the X-axis direction. The waveguide 11 of the second embodiment has a U-shape that is bent by 90° and extends in the X-axis direction and the Y-axis direction. The waveguide 11 of the second embodiment may have other shapes. To miniaturize the semiconductor optical element, the angle of bending of the waveguide 11 is preferably 90° or more.

Although the embodiments of the present invention have been described above in detail, the present invention is not limited to the specific embodiments, and various modifications and variations are possible within the scope of the gist of the present invention described in the claims.

What is claimed is:

1. A semiconductor optical device comprising:
   an SOI substrate having a waveguide of silicon; and
   a plurality of gain regions of a group III-V compound semiconductor having an optical gain bonded to the SOI substrate,
   a first electrode and a second electrode provided on the SOI substrate,
   wherein the waveguide has a bent portion and multiple linear portions extending linearly and connected to each other through the bent portion,
   wherein a respective one of the gain regions is disposed on each of the multiple linear portions,
   wherein the respective gain region includes an n-type semiconductor layer, a core layer and a p-type semiconductor layer that are stacked in this order from the SOI substrate,
   wherein the n-type semiconductor layer is shared by the plurality of the gain regions and electrically connects the plurality of the gain regions,
   wherein the n-type semiconductor layer, the core layer, and the p-type semiconductor layer are each formed of the group III-V compound semiconductor,
   wherein the first electrode is connected to the n-type semiconductor layer, and the second electrode is connected to the p-type semiconductor layer of each of the gain regions,
   wherein the first electrode is provided on the n-type semiconductor layer, and has a first connection portion and a first pad portion connected to the n-type semiconductor layer,
   wherein the second electrode has a second pad portion connected to the p-type semiconductor layer of each of the gain regions, and
   wherein carriers are injected into the core layer of each of the gain regions by applying a voltage between the first pad portion and the second pad portion, which result in each of the gain regions emitting light.

2. The semiconductor optical device of claim 1, wherein a bending angle of the waveguide is 90 degrees or more.

3. The semiconductor optical device of claim 1, further comprising
   a first insulating film provided on both sides of the bent portion.

4. The semiconductor optical device of claim 1, further comprising
   a second insulating film covering a side surface of the respective gain region,
   wherein a width of the respective gain region is larger than a width of the waveguide.

5. The semiconductor optical device of claim 1, wherein a radius of curvature of the bent portion is 10 µm or more.

6. The semiconductor optical device of claim 1, wherein the waveguide includes three or more linear portions,
   wherein the respective one of the gain regions is disposed on each of the three or more linear portions.

7. The semiconductor optical device of claim 1,
   wherein the first connection portion is located between the gain regions,
   wherein the first pad portion is connected to the first connection portion, wherein the first pad portion has a width larger than the first connection portion, wherein the second electrode has a second connection portion connected to the p-type semiconductor layer, wherein the second connection portion is provided on the p-type semiconductor layer of each of the plurality of the gain regions, and wherein the second pad portion is connected to the second connection portion, and has a width larger than the second connection portion.

8. The semiconductor optical device of claim 1, wherein the respective gain region has a tapered portion located on the waveguide.

9. The semiconductor optical device of claim 1, wherein the SOI substrate is optically coupled to the waveguide and has a resonator formed of silicon.

* * * * *